United States Patent
Lee et al.

(10) Patent No.: US 11,626,569 B1
(45) Date of Patent: Apr. 11, 2023

(54) QUASI GLOBAL CATHODE CONTACT METHOD FOR ADVANCED PATTERNING

(71) Applicant: Applied Materials, Inc., Santa Clara, CA (US)

(72) Inventors: Jungmin Lee, Santa Clara, CA (US); Yu Hsin Lin, Zhubei (TW); Chung-Chia Chen, Hsinchu (TW); Ji Young Choung, Hwaseong-si (KR); Dieter Haas, San Jose, CA (US); Si Kyoung Kim, Gwangju-si (KR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/805,257

(22) Filed: Jun. 3, 2022

Related U.S. Application Data

(63) Continuation of application No. 17/653,329, filed on Mar. 3, 2022.

(60) Provisional application No. 63/264,893, filed on Dec. 3, 2021.

(51) Int. Cl.
*H01L 51/52* (2006.01)
*H01L 27/32* (2006.01)
*H01L 51/56* (2006.01)

(52) U.S. Cl.
CPC ...... *H01L 51/5225* (2013.01); *H01L 27/3246* (2013.01); *H01L 51/5253* (2013.01); *H01L 51/56* (2013.01)

(58) Field of Classification Search
CPC ... H01L 51/5225; H01L 51/5253–5256; H01L 51/56; H01L 27/3246
See application file for complete search history.

(56) References Cited

U.S. PATENT DOCUMENTS

| | | | |
|---|---|---|---|
| 2019/0229152 A1* | 7/2019 | Wang | H01L 27/3246 |
| 2020/0194505 A1* | 6/2020 | Tang | H01L 27/323 |
| 2020/0243625 A1* | 7/2020 | Beak | H01L 27/3262 |
| 2021/0135150 A1* | 5/2021 | Wang | H01L 51/5228 |
| 2021/0184157 A1* | 6/2021 | Tan | H01L 27/3246 |
| 2021/0217998 A1* | 7/2021 | Son | H01L 51/0023 |
| 2021/0351373 A1* | 11/2021 | Chen | H01L 51/5234 |

\* cited by examiner

*Primary Examiner* — Shaun M Campbell
(74) *Attorney, Agent, or Firm* — Patterson + Sheridan, LLP

(57) ABSTRACT

Embodiments described herein relate to sub-pixel circuits and methods of forming sub-pixel circuits that may be utilized in a display such as an organic light-emitting diode (OLED) display. The sub-pixel circuit includes a plurality of contact overhangs. The plurality of contact overhangs are disposed between adjacent sub-pixels of a sub-pixel circuit to be formed. The contact overhangs are formed over a metal grid exposed through a PDL structure. A cathode is deposited via evaporation deposition to be in contact with the contact overhang. The metal grid is perpendicular to a plurality of metal layers disposed on the substrate.

20 Claims, 14 Drawing Sheets

QUASI GLOBAL CATHODE CONTACT METHOD FOR ADVANCED PATTERNING

CROSS-REFERENCE TO RELATED APPLICATIONS

This application is a continuation application of U.S. application Ser. No. 17/653,329, filed Mar. 3, 2022, which claims benefit of U.S. Provisional Patent Application No. 63/264,893, filed Dec. 3, 2021, which are herein incorporated by reference in their entirety.

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. In OLED devices include a plurality of sub-pixels defined by adjacent pixel-defining layer (PDL) structures. Each sub-pixel has an anode, organic light-emitting diode (OLED) material disposed on the anode, and a cathode disposed on the OLED material. To power one or more sub-pixels, a local assistant grid would be used to distribute input current to the cathode of the one or more sub-pixels. The use of a local assistant grid may lead to an increase in leakage current. To improve OLED performance, there remains a need for improved cathode contact. Accordingly, what is needed in the art are sub-pixel circuits and methods of forming sub-pixel circuits to increase pixel-per-inch and provide improved OLED performance.

SUMMARY

In one embodiment, a sub-circuit is provided. The sub-circuit includes a metal grid disposed on an anode-defining layer (ADL). The ADL exposes anodes disposed over a substrate. The sub-circuit further includes inorganic overhang structures disposed over the metal grid. Adjacent ADLs define a plurality of sub-pixels of the sub-circuit. Each sub-pixel of the plurality of sub-pixels include an anode defined by the ADL, an organic light-emitting diode (OLED) material disposed over and in contact with the anode, and a cathode disposed over the OLED material. The sub-circuit further includes at least one contact overhang disposed on a respective assistant cathode line of the metal grid. The contact overhang is disposed between two sub-pixels of the plurality of sub-pixels and the cathode contacts the contact overhang.

In another embodiment, a device is provided. The device includes a substrate and a plurality of metal layers disposed over the substrate and an anode-defining layer (ADL) disposed over the plurality of metal layers and the substrate. The ADL defines anodes of the device. The device further includes a metal grid disposed over the ADL. Adjacent ADLs define sub-pixels of the device. The device further includes a plurality of sub-circuits. Each sub-circuit includes the metal grid disposed on the ADL, inorganic overhang structures disposed over the metal grid, and a first plurality of sub-pixels. Each sub-pixel of the first plurality of sub-pixels includes an anode defined by the ADL, an organic light-emitting diode (OLED) material disposed over and in contact with the anode, and a cathode disposed over the OLED material. The device further includes at least one contact overhang disposed on a respective assistant cathode line of the metal grid. The contact overhang disposed between two sub-pixels of the first plurality of sub-pixels and the cathode contacts the contact overhang.

In yet another embodiment, a device is provided. The device includes a substrate and a plurality of metal layers disposed over the substrate and an anode-defining layer (ADL) disposed over the plurality of metal layers and the substrate. The ADL defines anodes of the device. The device further includes a metal grid disposed over the ADL. Adjacent ADLs define sub-pixels of the device. The device further includes a plurality of sub-circuits. Each sub-circuit includes the metal grid disposed on the ADL, inorganic overhang structures disposed over the metal grid, and a first plurality of sub-pixels. Each sub-pixel of the first plurality of sub-pixels includes an anode defined by the ADL, an organic light-emitting diode (OLED) material disposed over and in contact with the anode, and a cathode disposed over the OLED material. The device further includes at least one contact overhang disposed on a respective assistant cathode line of the metal grid. The contact overhang disposed between two sub-pixels of the first plurality of sub-pixels and the cathode contacts at least a stem portion of the at least one contact overhang. The at least one contact overhang includes a contact overhang ratio defined as a ratio of an overhang height to an overhang depth, wherein the contact overhang ratio is about 1.0:1.0 to about 1.0:1.5.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a display. More specifically, embodiments described herein relate to sub-pixel circuits and methods of forming sub-pixel circuits that may be utilized in a display such as an organic light-emitting diode (OLED) display. In one embodiment, which can be combined with other embodiments described herein, the display is a top emission (TE) OLED display. In another embodiment, which can be combined with other embodiments described herein, the display is a passive-matrix (PM) or an active matrix (AM) OLED display. Each sub-pixel has the OLED material configured to emit a white, red, green, blue or other color light when energized. For example, the OLED material of a first sub-pixel emits a red light when energized, the OLED material of a second sub-pixel emits a green light when energized, and the OLED material of a third sub-pixel emits a blue light when energized.

Figure 1A:
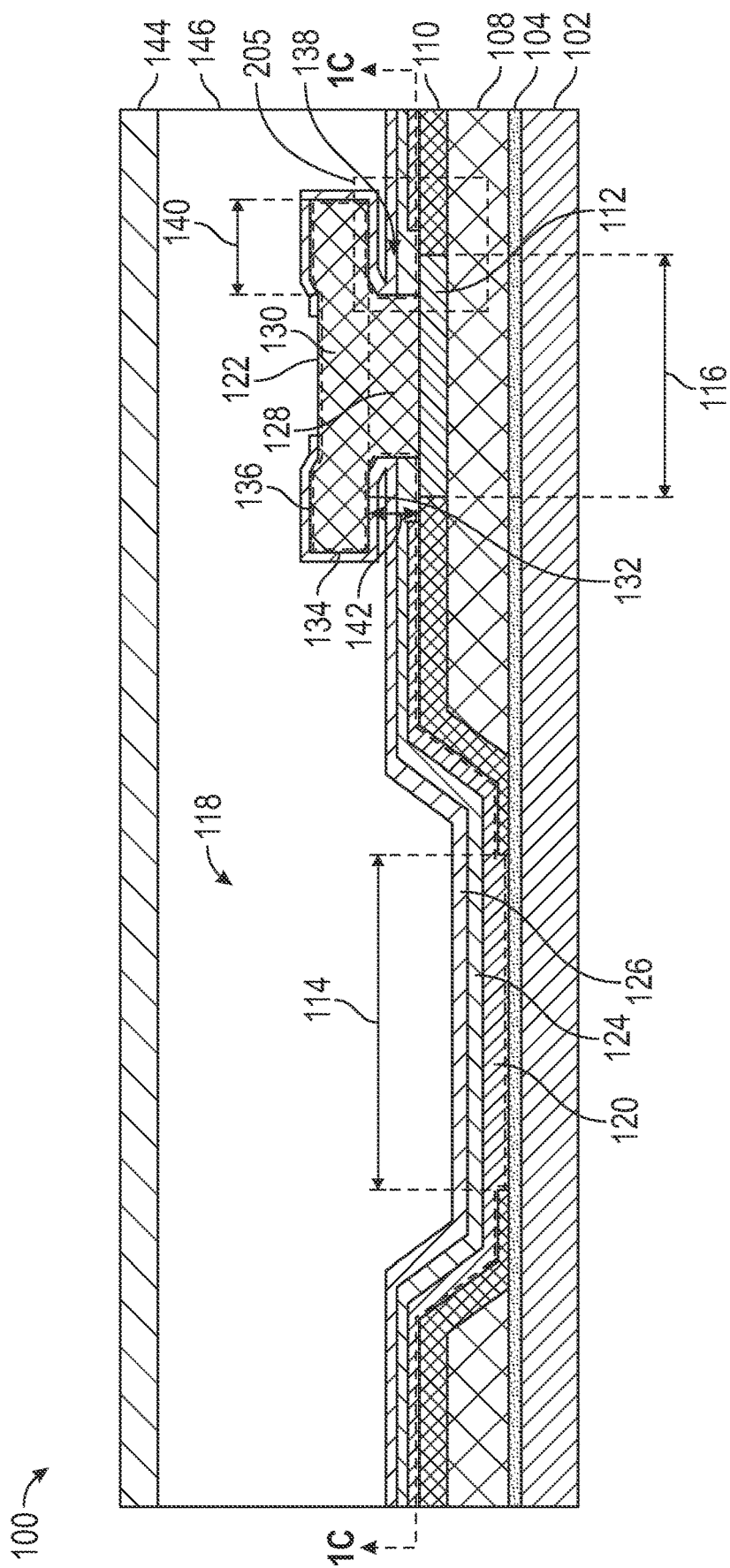
FIGS. 1A and 1C are schematic, cross-sectional views of a sub-pixel circuit according to embodiments described herein.
Figure 1B:
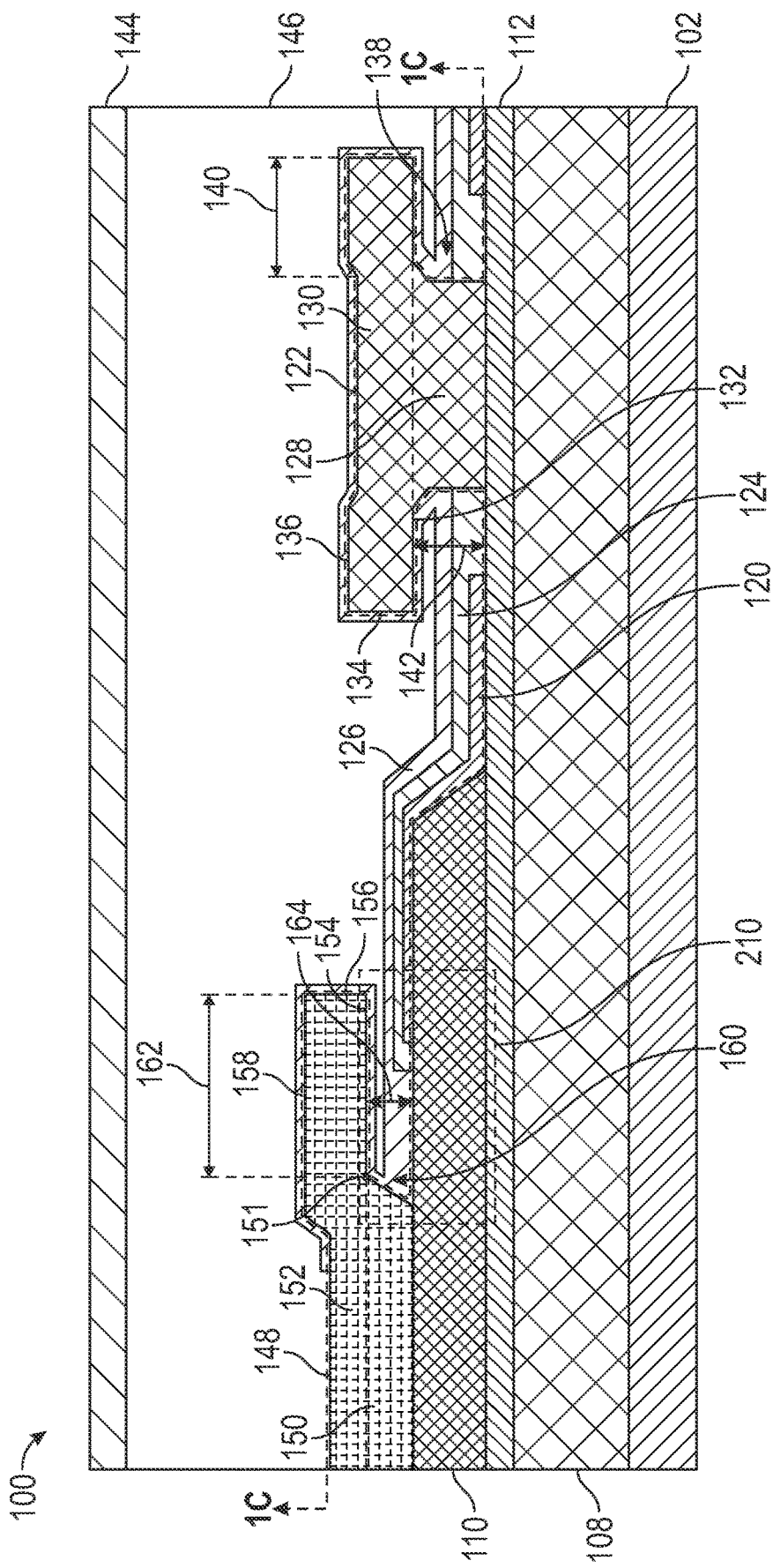
FIGS. 1B and 1D are schematic, cross-sectional view of a sub-pixel circuit according to embodiments described herein.
Figure 1C:
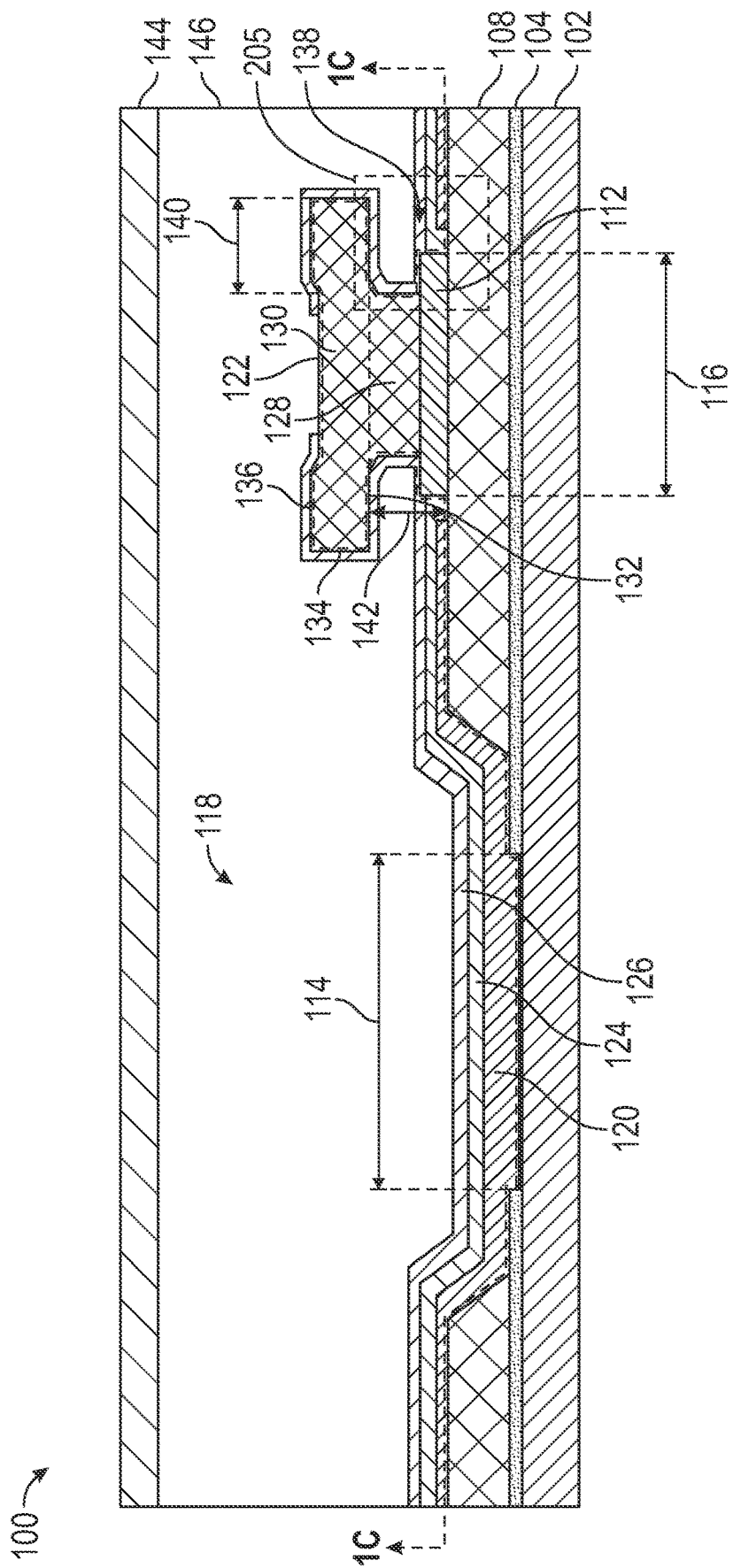

FIGS. 1A and 1C are schematic, cross-sectional views of a sub-pixel circuit 100. FIG. 1A is taken along a section line of FIG. 1E. The sub-pixel circuit 100 includes a substrate 102. The substrate 102 includes, but is not limited to, silicon (Si), silicon dioxide ($SiO_2$), fused silica, quartz, silicon carbide (SiC), germanium (Ge), silicon germanium (SiGe), indium phosphide (InP), gallium arsenide (GaAs), gallium nitride (GaN), silicon nitride (SiN), or sapphire containing materials. A plurality of metal layers 104 are disposed over the substrate 102. The metal layers 104 are configured to operate as anodes of respective sub-pixels. The metal layers 104 include, but are not limited to, chromium, titanium, gold, silver, copper, aluminum, ITO, a combination thereof, or other suitably conductive materials. The metal layers 104 may be transparent or reflective depending on whether the sub-pixel circuit 100 will be utilized as a bottom emission display or a top emission display.

An anode-defining layer (ADL) 108 is disposed on the metal layers 104 and the substrate 102. Openings in the ADL 108 expose an anode 114 of the metal layer 104. Each respective sub-pixel 118 of the sub-pixel circuit 100 includes the anode 114. In one embodiment, the ADL 108 includes, but is not limited to, a polyimide material. In another embodiment, the ADL 108 includes a first inorganic insulator material. The first inorganic insulator material includes, but is not limited to, silicon oxide ($SiO_2$), silicon nitride ($Si_3N_4$), silicon oxynitride ($Si_2N_2O$), magnesium fluoride ($MgF_2$), or combinations thereof.

In one embodiment, as shown in FIG. 1A, a pixel-defining layer (PDL) structure 110 is disposed on the substrate 102, the plurality of metal layers 104, and the ADL 108. The PDL structure 110 includes a second inorganic insulator material. The second inorganic insulator material includes, but is not limited to, silicon oxide ($SiO_2$), silicon nitride ($Si_3N_4$), silicon oxynitride ($Si_2N_2O$), magnesium fluoride ($MgF_2$), or combinations thereof. In some embodiments, the first inorganic insulator material and the second inorganic insulator material are the same material. Adjacent PDL structures 110 define a respective sub-pixel 118 and further define the anode 114 of the metal layer 104 of the sub-pixel 118 in the sub-pixel circuit 100. In another embodiment, as shown in FIG. 1C, the PDL structure 110 is not provided. Adjacent ADLs 108 define a respective sub-pixel 118 in the sub-pixel circuit 100.

Prior to the deposition of the PDL structure 110 (if needed) over the ADL 108, a metal grid 112 is disposed over the ADL 108. The PDL structure 110 is subsequently disposed over the ADL 108 and the metal grid 112, as shown in FIG. 1A. Disposing the metal grid 112 on the ADL 108 provides for insulation of the metal grid 112. The metal grid 112 is disposed in between each respective sub-pixel 118. The metal grid 112 includes a conductive material, such as a metal. For example, the metal grid 112 includes, but is not limited to, chromium, titanium, aluminum, ITO, or a combination thereof. The metal grid 112 has a metal grid width 116. The metal grid width 116 is at least 1 μm. In one example, the metal grid width 116 is about 10 μm. In another example, the metal grid width 116 is between about 20 μm and about 30 μm.

A contact overhang 122 is formed on the metal grid 112. The contact overhang 122 includes, but it not limited to, a conductive, metal-containing material. For example, the metal-containing material includes copper, titanium, aluminum, molybdenum, silver, indium tin oxide, indium zinc oxide, or combinations thereof. The contact overhang 122 includes a stem portion 128 and an overhang portion 130. The overhang portion 130 includes a bottom surface 132, a side surface 134, and a top surface 136. The bottom surface 132 of the overhang portion 130 is wider than the stem portion 128 to form a first overhang 138. The first overhang 138 allows for the overhang portion 130 of the contact overhang 122 to create a shadowing effect over the stem portion 128. In one embodiment, which can be combined with other embodiments described herein, the metal-containing material of stem portion 128 and the overhang portion 130 is the same. In another embodiment, which can be combined with other embodiments described herein, the metal-containing material of stem portion 128 and the overhang portion 130 is different.

The sub-pixel circuit 100 includes the plurality of sub-pixels 118. The sub-pixel circuit 100 of the embodiments described herein may include one or more sub-pixels 118, such as a first and a second sub-pixel. Each sub-pixel 118 has an organic light-emitting diode (OLED) material 120. The OLED material 120 is disposed on the metal layer 104. In one example, as shown in FIG. 1A, the OLED material 120 is also disposed on the adjacent PDL structures 110. In another example, as shown in FIG. 1C, the OLED material 120 is also disposed on the ADL 108. The OLED material 120 may be deposited via evaporation deposition. The OLED material 120 is configured to emit a white, red, green, blue or other color light when energized. For example, the OLED material 120 of the sub-pixel 118 is configured to emit one of a red light when energized, emit a green light when energized, emit a blue light when energized, or emit a white light when energized. The OLED material 120 may include one or more of a hole injection layer (HIL), a hole transport layer (HTL), an emissive layer (EML), and an electron transport layer (ETL).

A cathode 124 is disposed over the OLED material. The cathode 124 includes a conductive material, such as a metal. For example, the cathode 124 includes, but is not limited to, chromium, titanium, aluminum, ITO, or a combination thereof. The cathode 124 is disposed over the OLED material 120 in each sub-pixel 118. The shadowing effect of the first overhang 138 defines an angle of deposition during evaporation deposition of each of the OLED material 120 and the cathode 124. The OLED material 120 does not contact the contact overhang 122 and the metal grid 112. The cathode 124 contacts at least the stem portion 128 of the contact overhang 122 and the metal grid 112. In some embodiments, which can be combined with other embodiments described herein, the cathode 124 contacts the stem portion 128 and the overhang portion 130 of the contact overhang 122.

The contact overhang 122 includes an overhang depth 140. The overhang depth 140 is defined as the distance from the stem portion 128 to the side surface 134. The contact overhang 122 further includes an overhang height 142. In FIG. 1A, the overhang height 142 is defined as the distance from the PDL structure 110 to the bottom surface 132. In FIG. 1C, the overhang height 142 is defined as the distance from the ADL 108 to the bottom surface 132. A contact overhang ratio is defined as the ratio of the overhang height 142 to the overhang depth 140. The contact overhang ratio of the contact overhang 122 is about 1.0:0.5 to about 1.0:3.0. For example, the contact overhang ratio of the contact overhang 122 is about 1.0:1.5. The contact overhang ratio allows for the cathode 124 to extend under the first overhang 138 such that the cathode 124 contacts at least the stem portion 128 of the contact overhang 122.

Each sub-pixel 118 includes include an encapsulation layer 126. The encapsulation layer 126 may be or may correspond to a local passivation layer. The encapsulation layer 126 of a respective sub-pixel 118 is disposed over the cathode 124 (and the OLED material 120) and the PDL structures 110 (if provided). The encapsulation layer 126 includes a non-conductive inorganic material, such as the silicon-containing material. The silicon-containing material may include $Si_3N_4$ containing materials. In one embodiment, which can be combined with other embodiments described herein, the encapsulation layer 126 extends under at least a portion of the overhang portion 130 of the contact overhang 122 and along the stem portion 128. In some embodiments, which can be combined with other embodiments described herein, the encapsulation layer 126 is disposed over the bottom surface 132 of the contact overhang 122. In some embodiments, which can be combined with other embodiments described herein, the encapsulation layer 126 is disposed over the side surface 134 of the contact overhang 122 and the top surface 136 of the contact overhang 122.

The sub-pixel circuit 100 may further include at least a global passivation layer 144 disposed over the contact overhang 122 and the encapsulation layers 126. An intermediate layer 146 may be disposed between the global passivation layer 144 and the contact overhang 122 and the encapsulation layers 126. The intermediate layer 146 may be an inkjet layer. The inkjet layer may include an acrylic material.

Figure 1D:
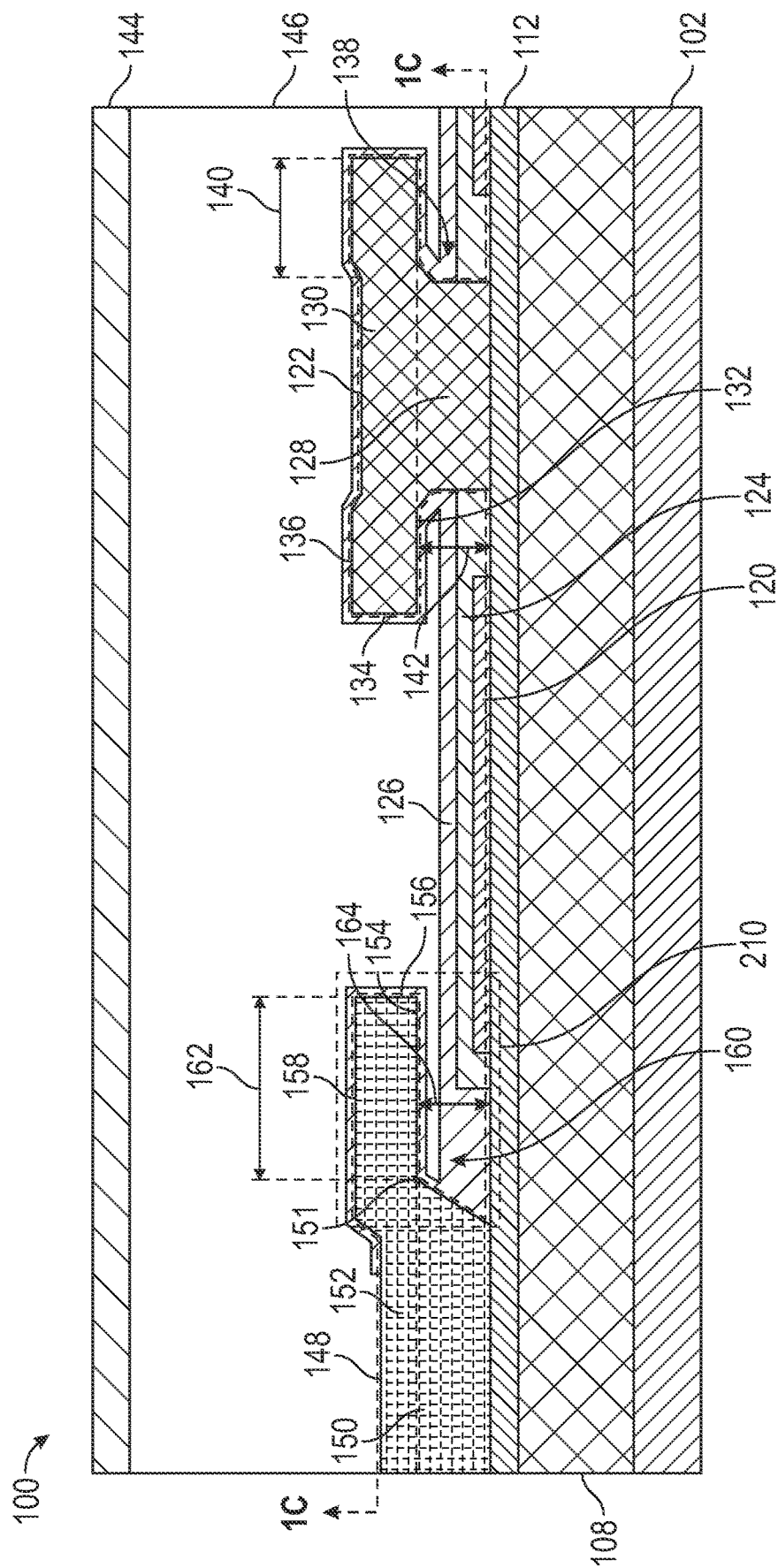

FIGS. 1B and 1D are schematic, cross-sectional views of a sub-pixel circuit 100. FIG. 1B is taken along a section line of FIG. 1E. As described above, the sub-pixel circuit 100 includes the metal grid 112, the contact overhang 122, the OLED material 120, the cathode 124, and the encapsulation layer 126. In one example, as shown in FIG. 1B, the sub-pixel circuit 100 includes the PDL structures 110. In another example, as shown in FIG. 1C, the sub-pixel circuit 100 does not include the PDL structures 110.

In one example, as shown in FIG. 1B, inorganic overhang structures 148 are disposed on the PDL structures 110. In another example, as shown in FIG. 1D, the inorganic overhang structures 148 are disposed on the metal grid 112. The inorganic overhang structures 148 are permanent to the sub-pixel circuit 100. The inorganic overhang structures 148 further define each sub-pixel 118 of the sub-pixel circuit 100. The inorganic overhang structures 148 include at least one of a non-conductive inorganic material or a conductive inorganic material. The non-conductive inorganic material includes, but it not limited to, an inorganic silicon-containing material or a polymer material. For example, the silicon-containing material includes oxides or nitrides of silicon, or combinations thereof. The conductive inorganic material includes, but it not limited to, a metal-containing material. For example, the metal-containing material includes copper, titanium, aluminum, molybdenum, silver, indium tin oxide, indium zinc oxide, or combinations thereof. The inorganic overhang structures 148 impede the continuous deposition of the OLED material 120 and the cathode 124.

The inorganic overhang structure 148 includes a structure stem portion 150 and a structure overhang portion 152. The structure overhang portion 152 includes a structure bottom surface 154, a structure side surface 156, and a structure top surface 158. The structure bottom surface 154 is wider than the structure stem portion 150 to form a second overhang 160. The second overhang 160 allows for the structure overhang portion 152 of the contact overhang 122 to shadow the structure stem portion 150. In one embodiment, which can be combined with other embodiments described herein, the structure stem portion 150 and the structure overhang portion 152 include the same material. In another embodiment, which can be combined with other embodiments described herein, the structure stem portion 150 and the structure overhang portion 152 include a different material.

The inorganic overhang structure 148 includes an overhang structure depth 162. The overhang structure depth 162 is defined as the distance from a top point 151 of the structure stem portion 150 to the structure side surface 156. The inorganic overhang structure 148 further includes an overhang structure height 164. In one example, as shown in FIG. 1B, the overhang structure height 164 is defined as the distance from the PDL structure 110 to the structure bottom surface 154. In another example, as shown in FIG. 1D, the overhang structure height 164 is defined as the distance from the metal grid 112 to the structure bottom surface 154. An overhang structure ratio is defined as the ratio of the overhang structure height 164 to the overhang structure depth 162. The overhang structure ratio of the inorganic overhang structure 148 is about 1.0:2.0 to about 1.0:3.0. The overhang structure ratio allows for the cathode 124 to be deposited under the second overhang 160 such that the cathode 124 contacts the OLED material 120 under the second overhang 160. In one example, as shown in FIG. 1B, the cathode 124 contacts the OLED material 120 and the PDL structure 110. In another example, as shown in FIG. 1D, the cathode 124 contacts the OLED material 120 and the metal grid 112.

In one embodiment, which can be combined with other embodiments described herein, the encapsulation layer 126 extends under at least a portion of the structure overhang portion 152 of the inorganic overhang structure 148 and along the structure stem portion 150. In some embodiments, which can be combined with other embodiments described herein, the encapsulation layer 126 is disposed over the structure bottom surface 154 of the inorganic overhang structure 148. In some embodiments, which can be combined with other embodiments described herein, the encapsulation layer 126 is disposed over the structure side surface 156 of the inorganic overhang structure 148 and the structure top surface 158 of the inorganic overhang structure 148.

Figure 1E:
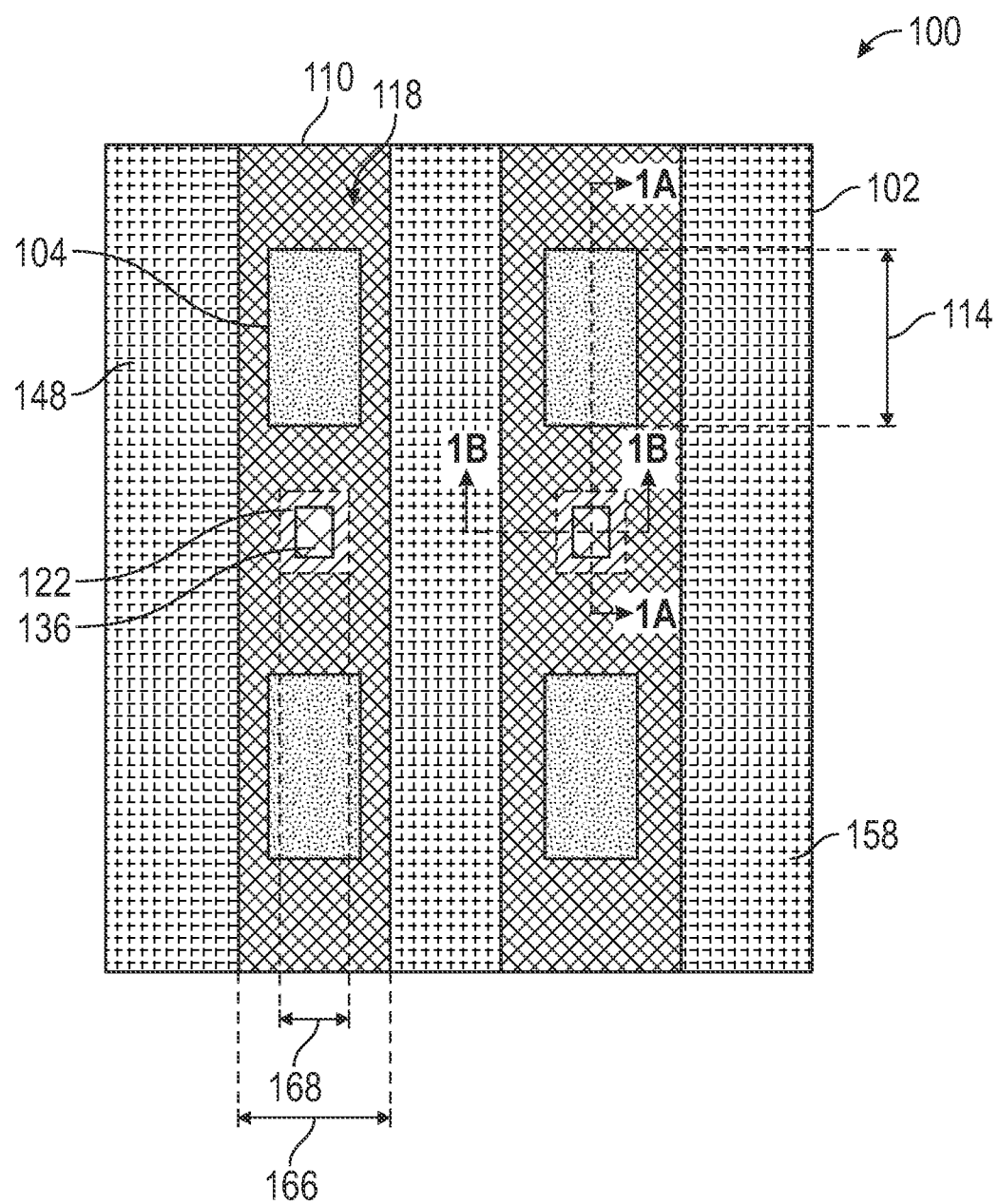
FIG. 1E is a schematic, top-view of a sub-pixel circuit according to embodiments described herein.

FIG. 1E is a schematic, top-view of a sub-pixel circuit 100. The sub-pixel circuit 100 shown in FIG. 1E corresponds to the sub-pixel circuit 100 depicted in FIG. 1A and FIG. 1B. The sub-pixel circuit 100 includes a first configuration of contact overhangs 122. As shown in FIG. 1E, the sub-pixel circuit 100 includes a plurality of pixel openings 166. Each pixel opening 166 is abutted by adjacent inorganic overhang structures 148 that define where each of the sub-pixels 118 are to be formed. The sub-pixel circuit 100 further includes the PDL structures 110 which further define where each of the sub-pixels 118 are to be formed. Adjacent PDL structures 110 define a respective sub-pixel and expose anodes 114 of the metal layer 104 (i.e., the anode) of the respective sub-pixel of the sub-pixel circuit 100. Contact overhangs 122 are disposed between adjacent sub-pixels 118. The contact overhangs 122 are disposed in an exposed portion 168 of the PDL structures 110. The exposed portion 168 is formed in the PDL structure 110 to expose the metal grid 112 disposed on the ADL 108 thereunder. The exposed portion 168 allows for the contact overhangs 122 to contact the metal grid 112.

Figure 2A:
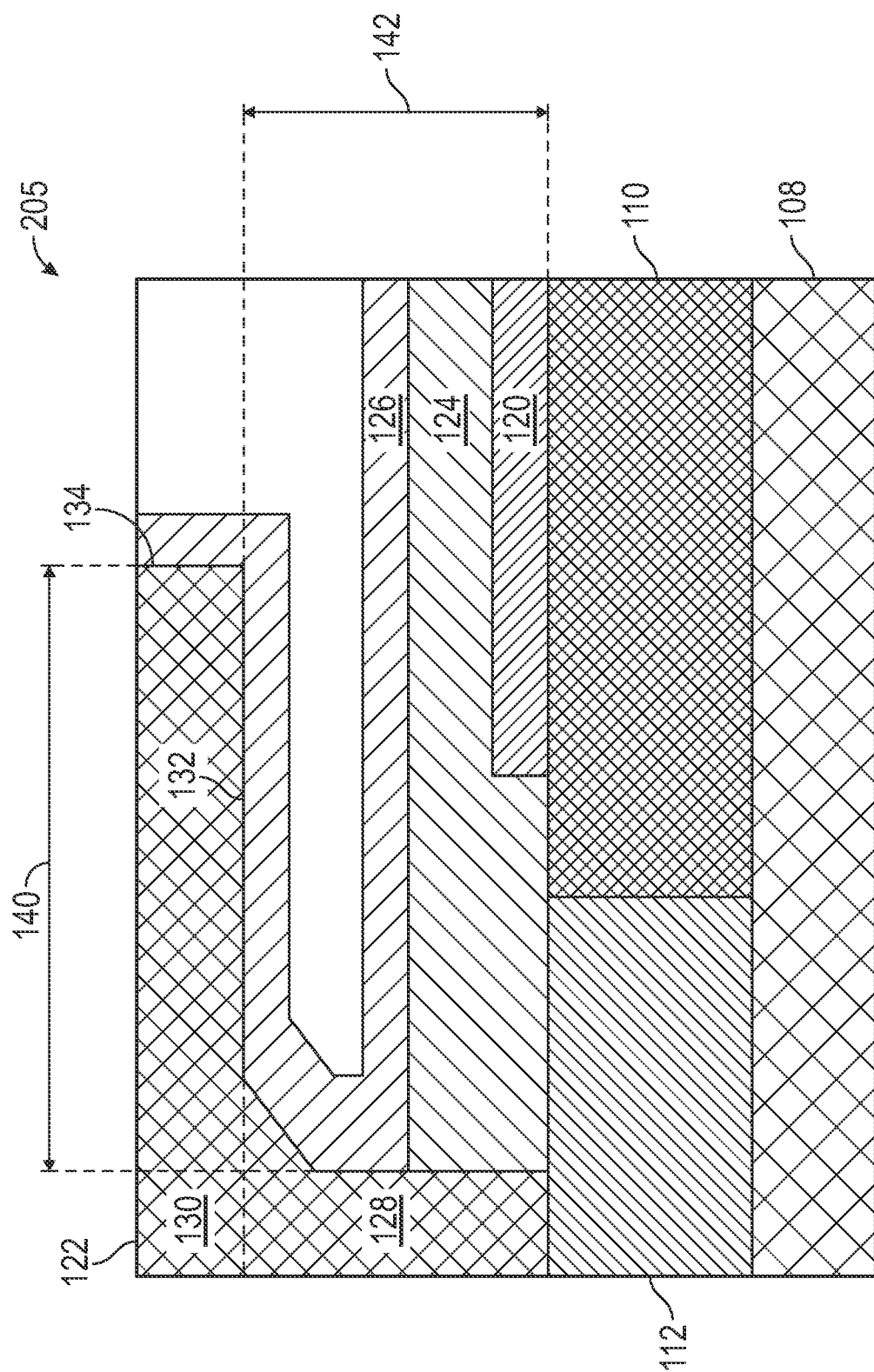
FIGS. 2A and 2B are schematic, cross-sectional views of a portion of a sub-pixel circuit according to embodiments described herein.

FIG. 2A is a schematic, cross-sectional view of a portion 205 of a sub-pixel circuit 100 shown in FIG. 1A. A contact overhang 122 is disposed in an exposed portion 168 of a PDL structure 110. The PDL structure 110 further includes an ADL 108 disposed under the PDL structure 110. The exposed portion 168 allows for the contact overhang 122 to contact the metal grid 112. The portion 205 shows the OLED material 120, the cathode 124, and the encapsulation layer 126. The OLED material 120 does not contact the contact overhang 122. The cathode 124 contacts at least a stem portion 128 of the metal grid 112. In some embodiments, which can be combined with other embodiments described herein, the cathode 124 contacts the PDL structure 110. The contact overhang 122 provides an electrical contact to the metal grid 112. Therefore, the cathode 124 in contact with the contact overhang 122 will receive an electrical current from the metal grid 112 via the contact overhang 122. The contact overhang ratio provides for the evaporation deposition of the cathode 124 to contact the contact overhang 122. Further, the evaporation deposition source can deposit the cathode 124 and the OLED material 120 at different angles to adjust where the cathode 124 and the OLED material 120 are disposed.

Device leakage occurs due to minimal distance between the anode 114 and the cathode 124. Additionally, device leakage may occur due to the OLED material 120 contacting the inorganic overhang structures 148. The contact overhangs 122 are operable to decrease leakage within the sub-pixel circuit 300 by increasing the distance between cathode contact points (i.e., locations where the cathode 124 contacts the contact overhangs 122) and the anodes 114 of the metal layer 104 in the sub-pixel compared to other approaches. For example, the distance between the cathode contact points (i.e., where the cathode 124 contacts the contact overhangs 122) and the anodes 114 of the metal layer 104 is between about 10 mm and about 5 inches. Increasing the distance will decrease the occurrence of leakage because the contact overhangs 122 reduce the number of cathode contact points, increasing the distance between cathode contact points and the anodes 114.

Figure 2B:
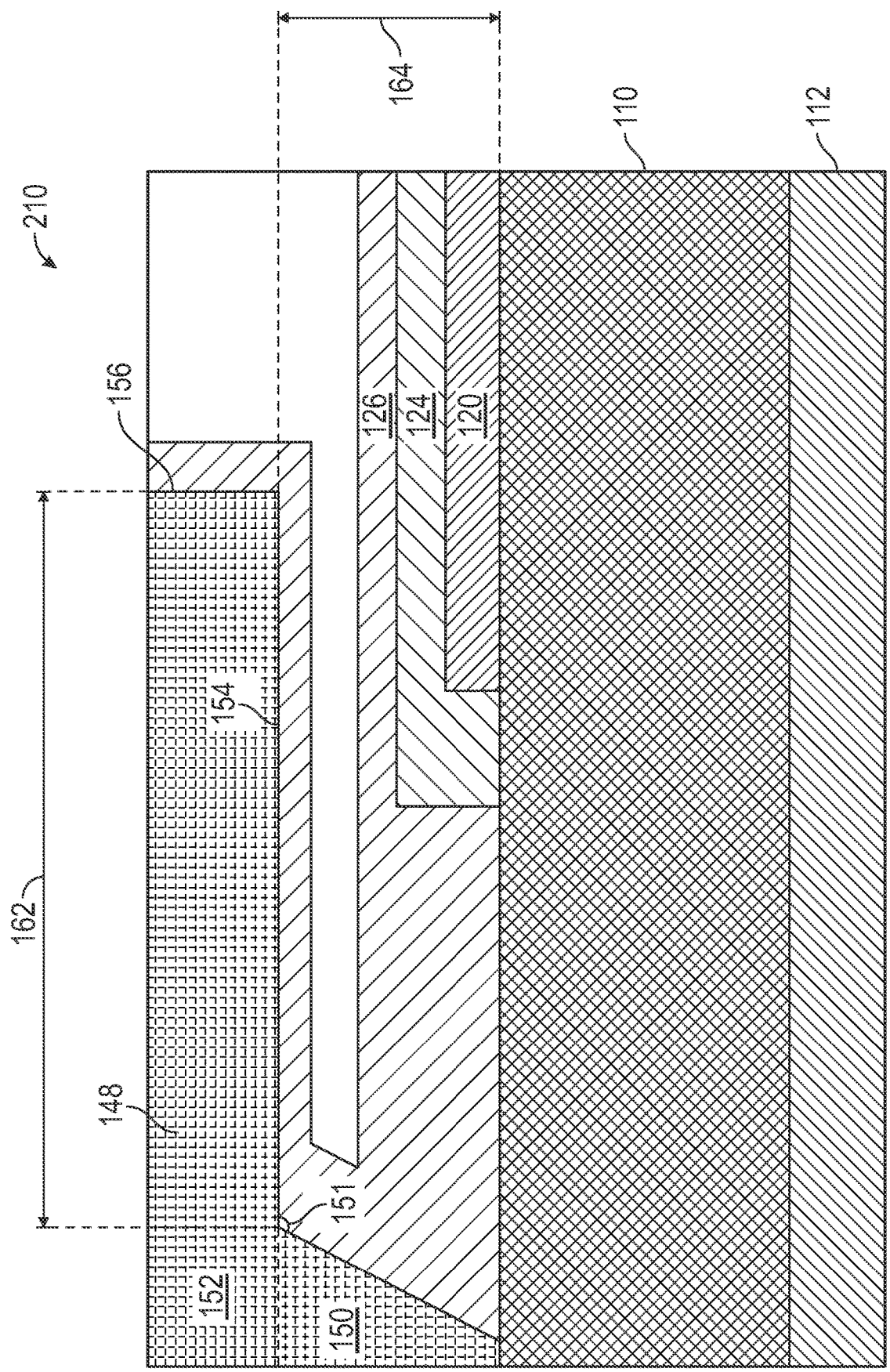

FIG. 2B is a schematic, cross-sectional view of a portion 210 of a sub-pixel circuit 100 shown in FIG. 1B. An inorganic overhang structure 148 is disposed over a PDL structure 110. The PDL structure 110 further includes an ADL 108 disposed under the PDL structure 110. The portion 210 shows the OLED material 120, the cathode 124, and the encapsulation layer 126. The OLED material 120 does not contact the contact overhang 122. The cathode 124 does not contact the inorganic overhang structure 148. The overhang structure ratio provides for the evaporation deposition of the cathode 124 to not contact the inorganic overhang structure 148. As such, the formation of the inorganic overhang structure 148 does not require the same precision. For example, the inorganic overhang structure 148 may be formed with less precision, so long as the overhang structure ratio prevents the continuous deposition of the OLED material 120 and the cathode 124. The design of the sub-pixel circuit 300 allows for a top emission display to be formed utilizing the inorganic overhang structures 148 generally utilized in bottom emission displays. The bottom emission displays utilize inorganic overhang structures 148 with lower photo accuracy requirements.

Figure 3:
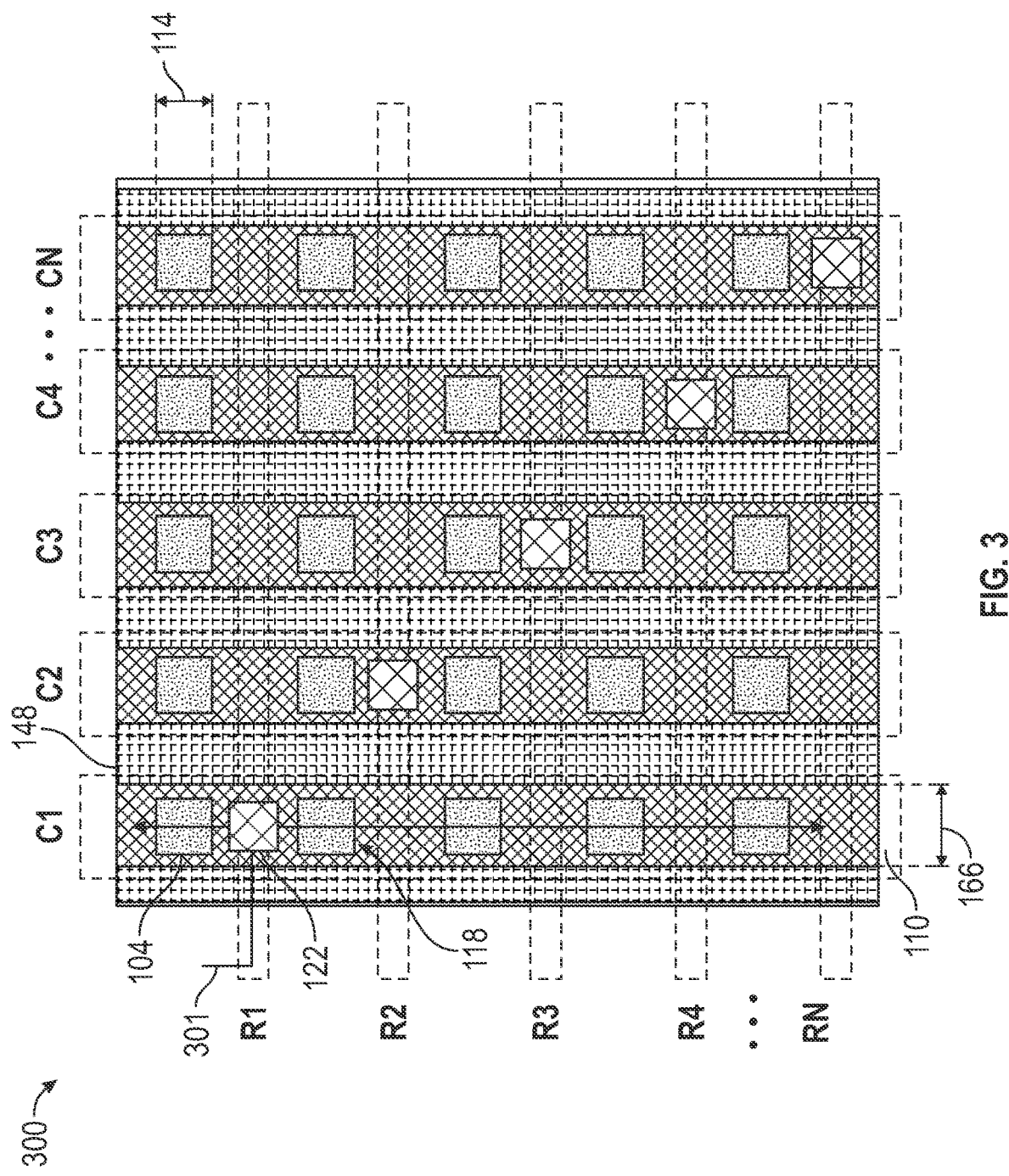
FIG. 3 is a schematic, top-view of a sub-pixel circuit according to embodiments described herein.

FIG. 3 is a schematic, top-view of a sub-pixel circuit 300. The sub-pixel circuit 300 is an embodiment of the sub-pixel circuit 100 (shown in FIGS. 1A-1E) having a second configuration of contact overhangs 122. The contact overhangs 122 are disposed between adjacent sub-pixels 118. The sub-pixel circuit 300 includes inorganic overhang structures 148. The sub-pixel circuit 300 includes a plurality of pixel openings 166. Each pixel opening 166 is abutted by adjacent inorganic overhang structures 148 that define where each of the sub-pixels 118 are to be formed. Adjacent PDL structures 110 and adjacent inorganic overhang structures 148 define the respective sub-pixels 118. As shown in FIG. 3, the sub-pixel circuit 300 includes a 5×5 grid of sub-pixels 118, such that there are 25 sub-pixels 118. Each sub-pixel 118 is operable to emit a different colored light. For example, each sub-pixel 118 may emit one of a red, green, blue, or white light when activated.

The sub-pixel circuit 300 includes sub-circuits $C_1, C_2, C_3, C_4, \ldots C_N$. The sub-circuits $C_1$-$C_N$ each include a plurality of sub-pixels 118. The sub-circuits $C_1$-$C_N$ correspond to a plurality of metal layers 104 in through the sub-pixel circuit 300 on a substrate 102. Each sub-circuit $C_1$-$C_N$ includes one or more contact overhangs 122. The sub-pixel circuit 300 further includes a metal grid 112. The metal grid 112 includes a plurality of assistant cathode lines $R_1, R_2, R_3, R_4, \ldots R_M$. The assistant cathode lines $R_1$-$R_M$ of the metal grid 112 are perpendicular to the sub-circuits $C_1$-$C_N$. The assistant cathode lines $R_1$-$R_M$ of the metal grid 112 are disposed below an anode defining layer (ADL) 108. The plurality of metal layers 104 are perpendicular to the metal grid 112. Each of the contact overhangs 122 are contacting the respective assistant cathode lines $R_1$-$R_M$ of the metal grid 112. Increasing the number of the sub-circuits $C_1$-$C_N$ and the number of the assistant cathode lines $R_1$-$R_M$ will provide for more sub-pixels 118 on the sub-pixel circuit 300.

The sub-pixel circuit 300 allows for individual activation of each of the sub-circuits $C_1$-$C_N$. To activate a specific sub-circuit $C_1$-$C_N$, a current is provided through the metal grid 112. The metal grid 112 of the assistant cathode line $R_1$-$R_M$ with the contact overhang 122 in the corresponding sub-circuit $C_1$-$C_N$ to be activated is provided the voltage and/or current. The current is supplied through the metal grid 112 and runs to the contact overhang 122. The metal grid 112 is connected to a common ground. In some embodiments, which can be combined with other embodiments described herein, a negative voltage can be applied to the metal grid 112. In one embodiment, which can be combined with other embodiments described herein, each metal grid 112 is electrically connected to a thin film transistor (not shown) on the substrate 102, which provides electrical current and/or voltage to each metal grid 112. The contact overhang 122 is in contact with the cathode 124 (shown in FIGS. 1A-1E) in the sub-circuit $C_1$-$C_N$ to be activated.

An example of current flow to activate the plurality of sub-pixels 118 in the sub-circuit $C_1$ is indicated by a line 301. As shown in FIG. 3, current is flowed through the metal grid 112 of the assistant cathode line $R_1$. The current flows to the contact overhang 122 in the sub-circuit $C_1$. The contact overhang 122 is in contact with the cathode 124 disposed along the sub-circuit $C_1$. Thus, current and/or voltage is operable to flow through the cathode 124 throughout the sub-circuit $C_1$. The current flows from the cathode 124 to the OLED material 120 and into the metal layer 104 of the sub-circuit $C_1$. The metal layer 104 of the column 11 is provided current, allowing for the activation of the sub-pixels 118 in the sub-circuit $C_1$.

The sub-pixels 118 in the sub-circuit $C_1$-$C_N$ are operable to emit light. The sub-pixel circuit 300 is operable to activate each sub-circuit $C_1$-$C_N$ individually and independently. In one embodiment, which can be combined with other embodiments described herein, the sub-pixels 118 in each of the sub-circuits $C_1$-$C_N$ are mono-colored. In another embodiment, which can be combined with other embodiments described herein, each of the sub-pixels 118 in the sub-circuits $C_1$-$C_N$ are operable to emit a different colored light. For example, the sub-pixels 118 in a first sub-circuit $C_1$ emit a red light, the sub-pixels 118 in a second sub-circuit $C_2$ emit a green light, the sub-pixels 118 in a third sub-circuit $C_3$ emit a blue light, and the sub-pixels 118 in a fourth sub-circuit $C_4$ emit a white light.

The contact overhangs 122 may be arranged in the sub-pixel circuit 300 as desired. Each of the sub-circuits $C_1$-$C_N$ includes at least one contact overhang 122. For example, each of the sub-circuits $C_1$-$C_N$ may include more than one contact overhang 122. The contact overhangs 122 are positioned such that a distance of about 50 mm to about 7 inches is between adjacent contact overhangs 122.

Figure 4:
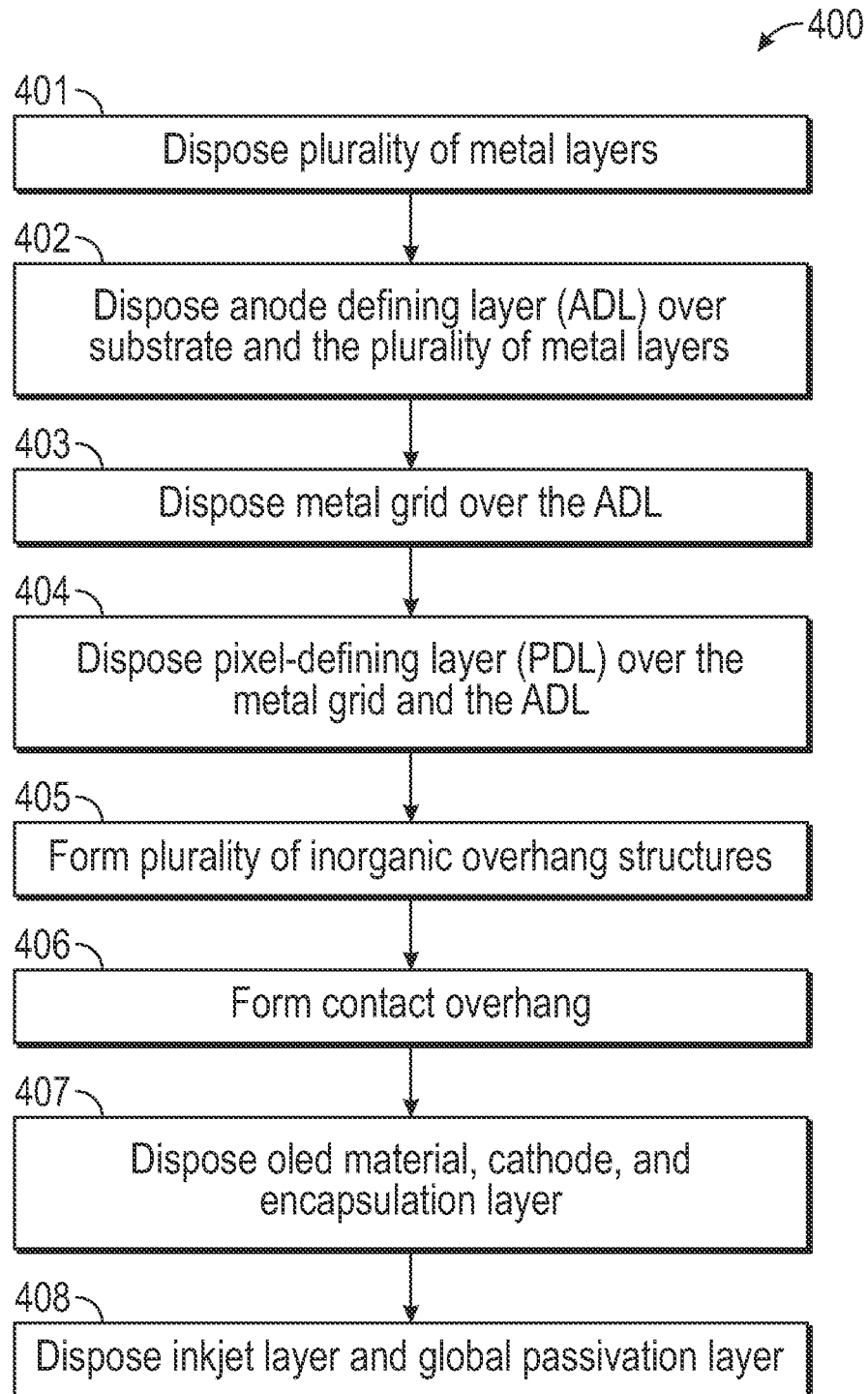
FIG. 4 is a flow diagram of a method for forming a sub-pixel circuit as shown in FIGS. 5A-5E and FIGS. 6A and 6B according to embodiments described herein.
Figure 5A:
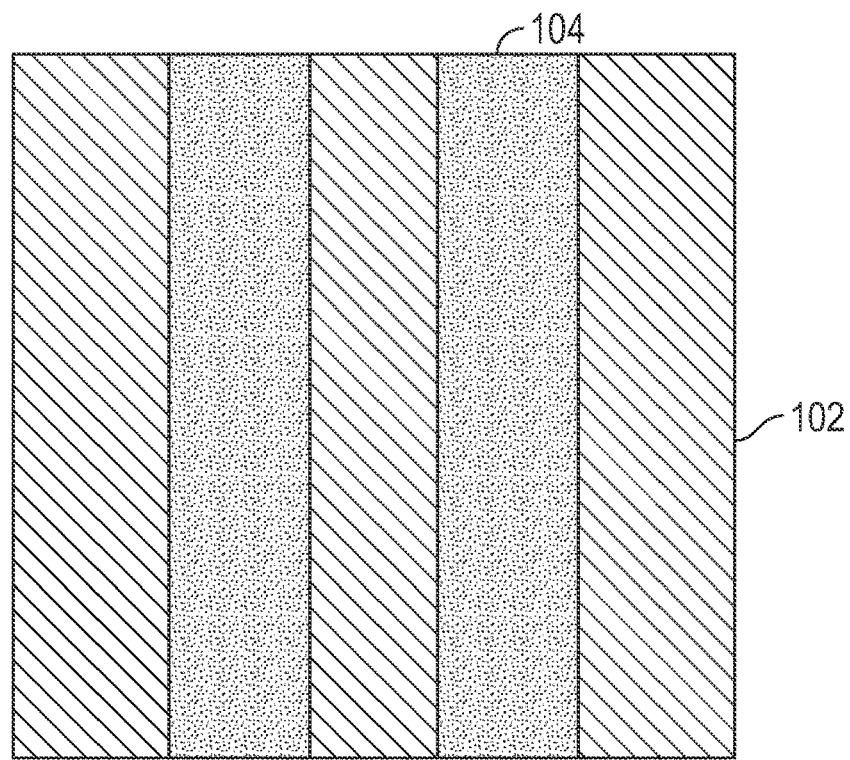
FIGS. 5A-5E are schematic, top-views of a sub-pixel circuit during a method according to embodiments described herein.
Figure 5B:
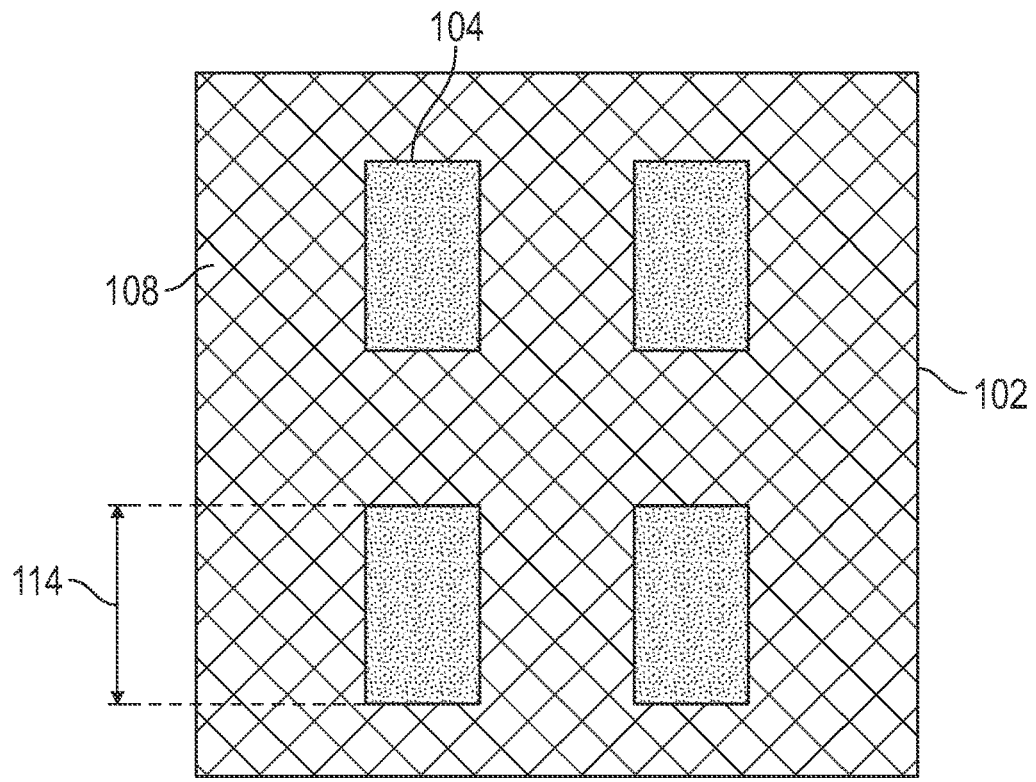
Figure 5C:
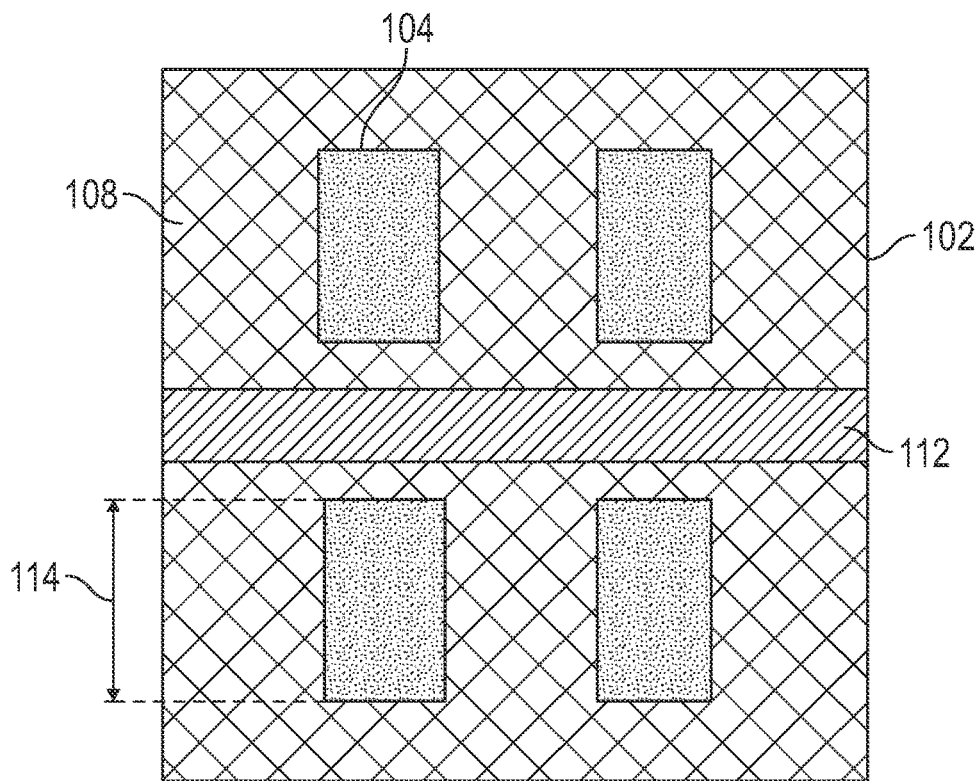
Figure 5D:
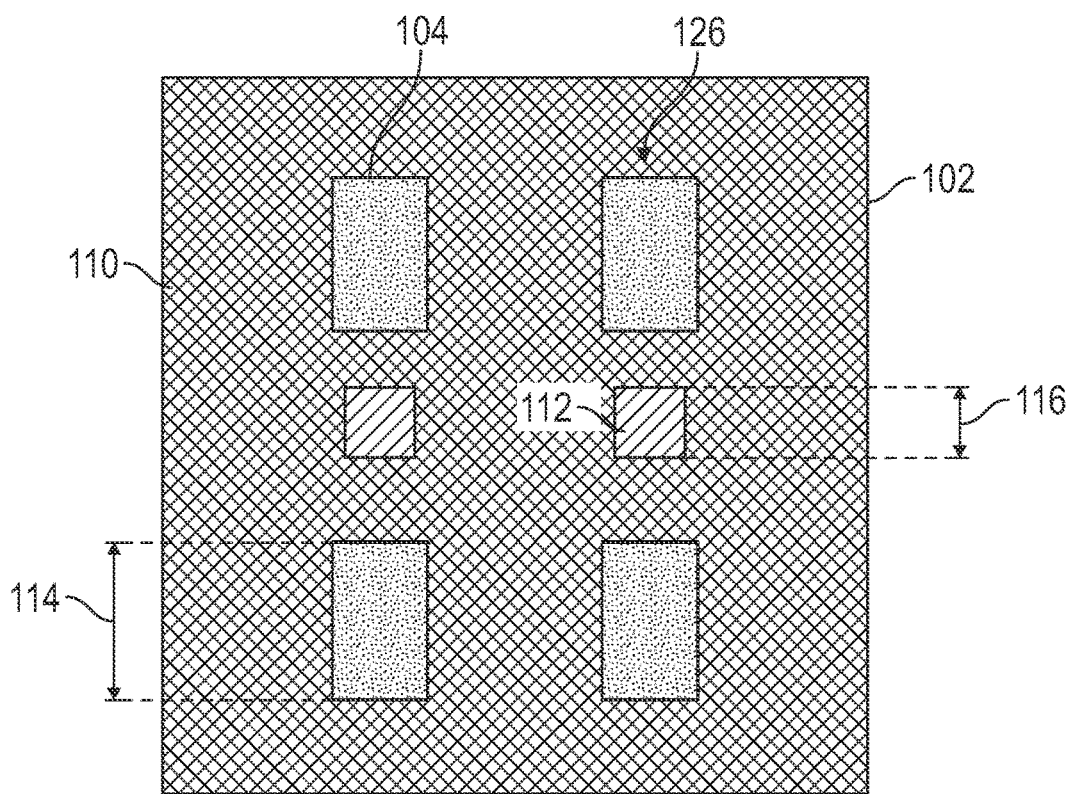
Figure 5E:
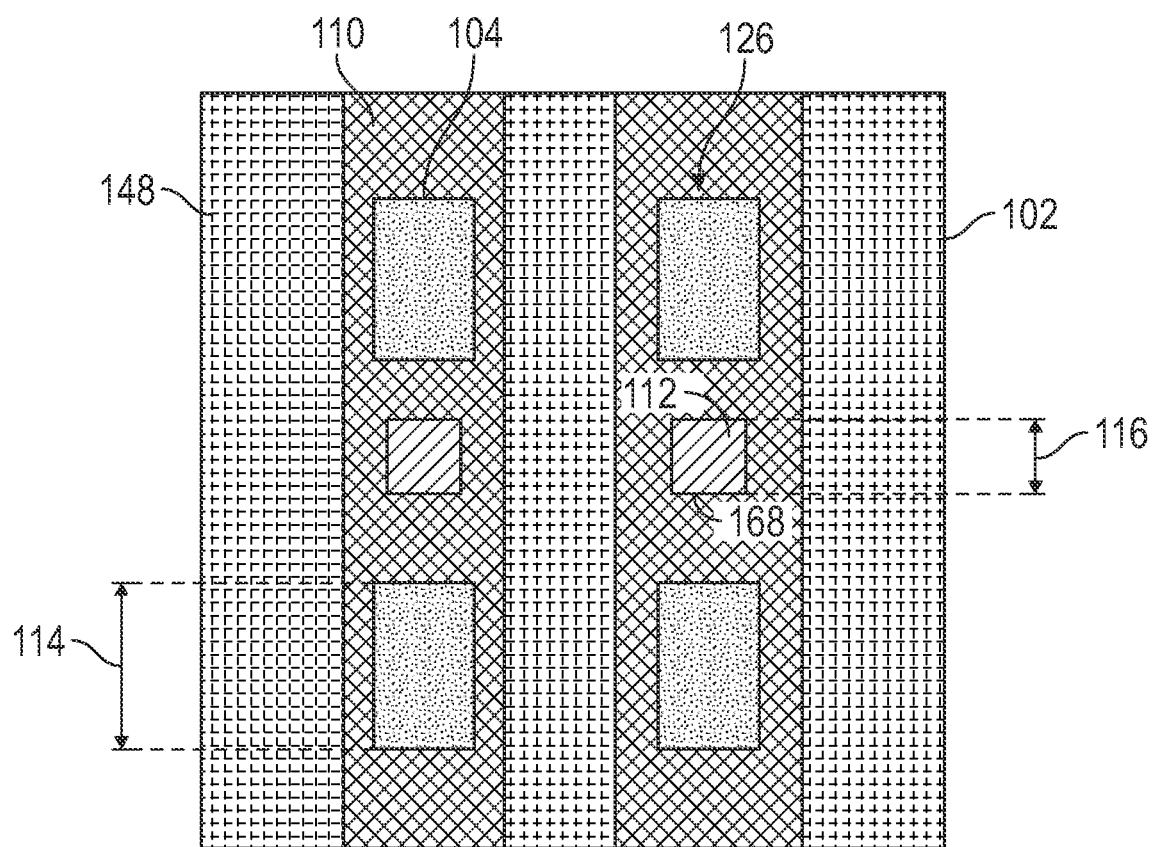
Figure 6A:
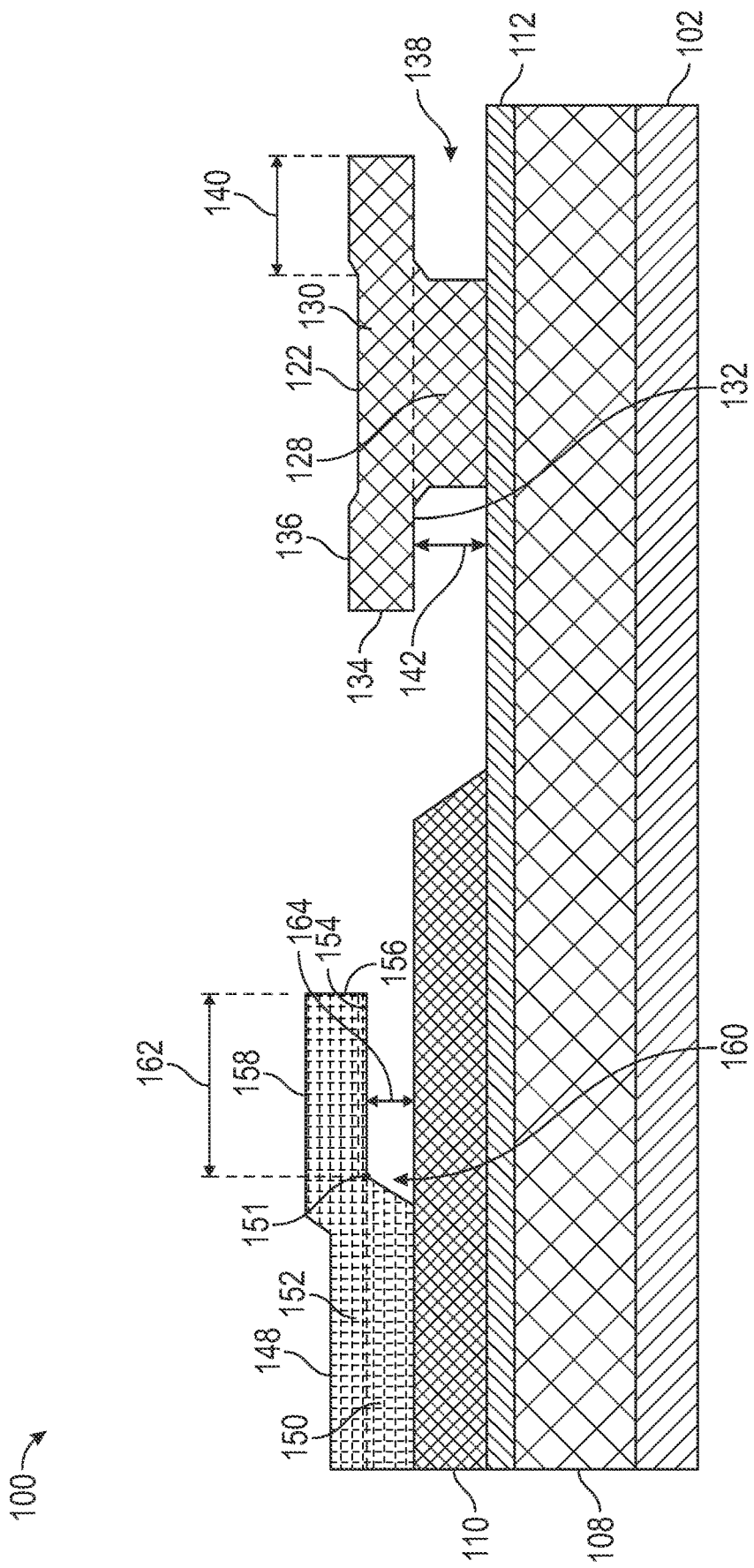
FIGS. 6A and 6B schematic, cross-sectional views of a sub-pixel circuit during a method according to embodiments described herein.
Figure 6B:
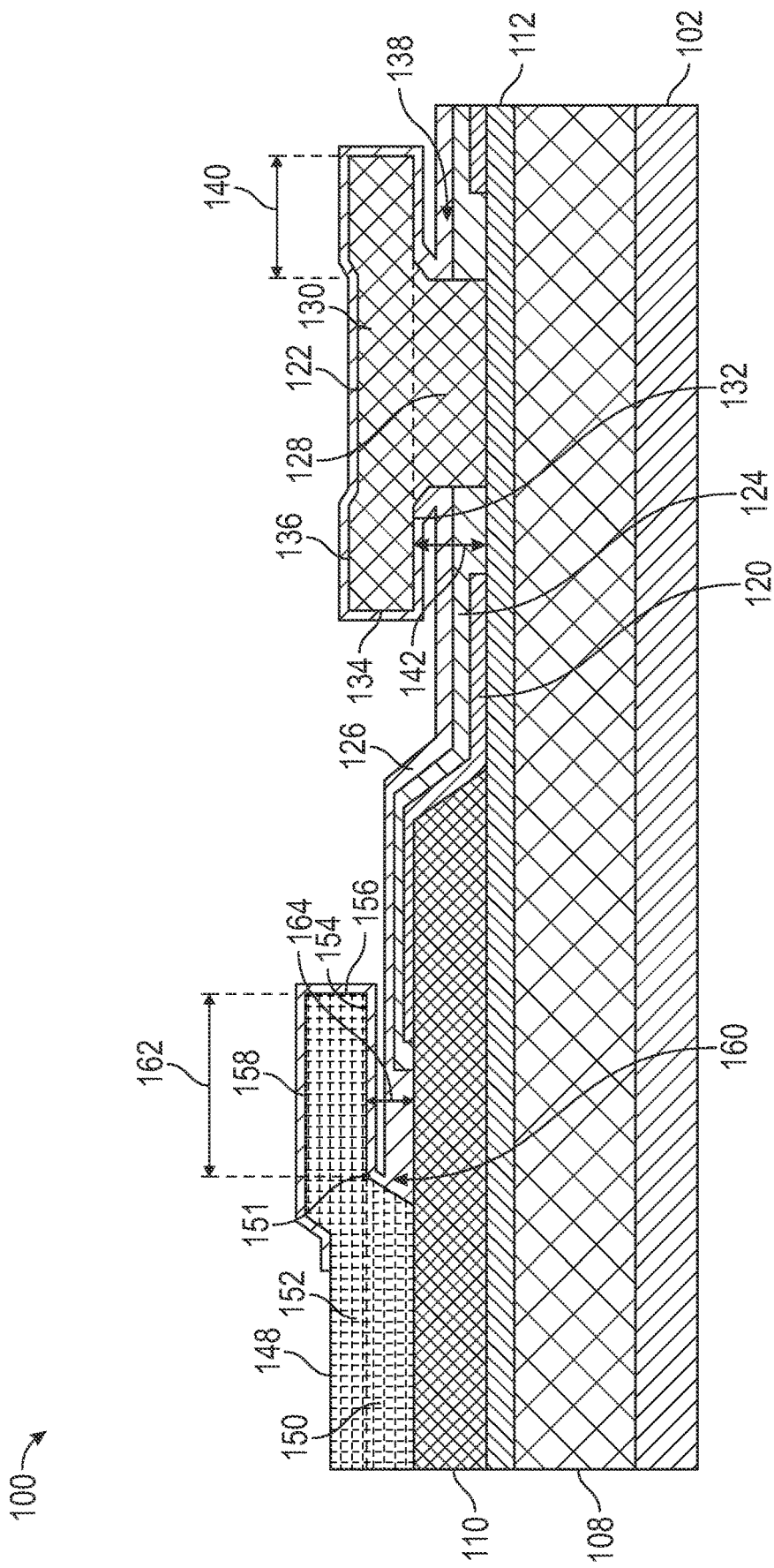

FIG. 4 is a flow diagram of a method 400 for forming a sub-pixel circuit 100 as shown in FIGS. 5A-5E and FIGS. 6A and 6B. The method 400 corresponds to the sub-pixel circuit 100 shown in FIG. 1A and FIG. 1B. FIGS. 5A-5E are schematic, top-views of a sub-pixel circuit 100 during a method 400. FIGS. 6A and 6B schematic, cross-sectional views of a sub-pixel circuit 100 during a method 400. To facilitate explanation, the method 400 will be described with reference to the sub-pixel circuit 100 with a first configuration of contact overhangs 122. However, the method 400 may be performed to form any sub-pixel circuit (e.g., the sub-pixel circuit 300) with any configuration of contact overhangs 122.

At operation 401, as shown in FIG. 5A, a plurality of metal layers 104 are disposed over a substrate 102. The plurality of metal layers 104 may be patterned on the substrate 102. In one embodiment, which can be combined other embodiments described herein, the metal layers 104 are pre-patterned on the substrate 102. For example, the substrate 102 is a pre-patterned indium tin oxide (ITO) glass substrate.

At operation 402, as shown in FIG. 5B, an anode-defining layer (ADL) 108 is disposed over the substrate 102 and the plurality of metal layers 104. The ADL 108 is further patterned to expose anodes 114 of the plurality of metal layers 104 (i.e., the anodes). Each of the anodes 114 is associated with a discrete sub-pixel 118 to be formed, such as the plurality of sub-pixels 118, shown in FIG. 1E. The ADL 108 may be patterned by patterning a photoresist coating and subsequent etching.

At operation 403, as shown in FIG. 5C, a metal grid 112 is disposed over the ADL 108. The metal grid 112 is disposed between the exposed portions of the plurality of metal layers 104. The metal grid 112 is disposed perpendicular with the plurality of metal layers 104. The metal grid 112 is insulated by the ADL 108.

At operation 404, as shown in FIG. 5D, a PDL structure 110 is disposed over the metal grid 112 and the ADL 108. The PDL structure 110 is further patterned to form an exposed portion 168 in the PDL structure 110. The exposed portion 168 exposes the metal grid 112 thereunder. The PDL structure 110 provides for moisture insulation of the metal grid 112.

At operation 405, as shown in FIG. 5E, a plurality of inorganic overhang structures 148 are formed. The plurality of inorganic overhang structures 148 are formed over the PDL structure 110. The plurality of inorganic overhang structures 148 are formed on opposite sides of the exposed portions of the plurality of metal layers 104. The plurality of inorganic overhang structures 148 are formed parallel with the plurality of metal layers 104. The plurality of inorganic overhang structures 148 include a second overhang 160. Adjacent PDL structures 110 and adjacent inorganic overhang structures 148 define respective sub-pixels 118.

At operation 406, as shown in FIG. 6A, contact overhangs 122 are formed in the exposed portion 168. The contact overhangs 122 are formed in the exposed portion 168 and contact the metal grid 112 disposed thereunder. The contact overhangs 122 are formed between adjacent sub-pixels 118. The number of the contact overhangs 122 that may be formed is not limited. As the sub-pixel circuit to be formed will control each sub-circuit individually, each sub-pixel does not require a contact overhang 122. The utilization of the contact overhangs 122 allows for large scale displays to be formed. The contact overhang 122 includes a first overhang 138.

At operation 407, as shown in FIG. 6B, OLED material 120, a cathode 124, and an encapsulation layer 126 are disposed. The OLED material 120, the cathode 124, and the encapsulation layer 126 are deposited by evaporation deposition. The shadowing of the first overhang 138 and the second overhang 160 provides for defining the evaporation deposition of each of the OLED material 120 and the cathode 124. The shadowing effect of the contact overhangs 122 and the inorganic overhang structures 148 define the angle at which the OLED material 120 and the cathode 124 are deposited during evaporation deposition. For example, the angle of evaporation deposition defined by the first overhang 138 provides for the cathode 124 to extend under the first overhang 138 and contact the contact overhang 122. The angle of evaporation defined by the second overhang 160 provides for the cathode 124 to not contact the contact overhang 122. Further, an evaporation deposition source is operable to deposit the OLED material 120 and the cathode 124 at different deposition angles to further define where the OLED material 120 and the cathode 124 are deposited. Operation 407 may be repeated for each additional sub-pixel 118. At operation 408, as shown in FIG. 1B, the intermediate layer 146 and the global passivation layer 144 are disposed.

In summation, embodiments described herein relate to sub-pixel circuits and methods of forming sub-pixel circuits that may be utilized in a display such as an organic light-emitting diode (OLED) display. The sub-pixel circuit includes a plurality of contact overhangs. The plurality of contact overhangs are disposed between adjacent sub-pixels of a sub-pixel circuit to be formed. The contact overhangs are formed over a metal grid disposed through a PDL structure. A cathode is deposited via evaporation deposition to be in contact with the contact overhang. The metal grid is perpendicular to a plurality of metal layers disposed on the substrate. To activate individual sub-circuits of the sub-pixel circuit, a current is applied to the metal grid. The current runs to the contact overhang and to the cathode in the sub-circuit to be activated. The current runs through an OLED material and to one of the plurality of metal layers to activate one of the sub-circuits of sub-pixels. The contact overhangs allow for overhang structures of the sub-circuit to be formed with less precision. The contact overhangs also decrease the occurrence of device leakage and thus, improve performance of the sub-circuit.

While the foregoing is directed to embodiments of the present disclosure, other and further embodiments of the disclosure may be devised without departing from the basic scope thereof, and the scope thereof is determined by the claims that follow.

What is claimed is:

1. A sub-circuit comprising:
a metal grid disposed on an anode-defining layer (ADL), the ADL exposing anodes disposed over a substrate;
inorganic overhang structures disposed over the metal grid, adjacent ADLs defining a plurality of sub-pixels of the sub-circuit, each sub-pixel of the plurality of sub-pixels comprising:
an anode defined by the ADL;
an organic light-emitting diode (OLED) material disposed over and in contact with the anode; and
a cathode disposed over the OLED material;
at least one contact overhang disposed on a respective assistant cathode line of the metal grid, the contact overhang disposed between two sub-pixels of the plurality of sub-pixels, wherein the cathode contacts the contact overhang; and
pixel-defining layer (PDL) structures disposed over the ADL,
wherein adjacent PDL structures further define the plurality of sub-pixels of the sub-circuit, and
wherein the at least one contact overhang is disposed in exposed portions of the PDL structures to expose the metal grid.

2. The sub-circuit of claim 1, wherein each sub-pixel of the plurality of sub-pixels further comprises an encapsulation layer disposed over the cathode, the contact overhang, the at least one contact overhang, and the inorganic overhang structures.

3. The sub-circuit of claim 2, wherein the encapsulation layer contacts a structure stem portion and a structure bottom surface of the inorganic overhang structures.

4. The sub-circuit of claim 2, further comprising an intermediate layer and a global passivation layer disposed over the inorganic overhang structures, the at least one contact overhang, and the encapsulation layer.

5. The sub-circuit of claim 1, wherein the cathode of the sub-circuit is in contact with a stem portion of the at least one contact overhang.

6. The sub-circuit of claim 1, wherein the sub-circuit is operable to be activated by applying a current to the respective assistant cathode line contacting the at least one contact overhang.

7. A device, comprising:
a substrate;
a plurality of metal layers disposed over the substrate and an anode-defining layer (ADL) disposed over the plurality of metal layers and the substrate, the ADL defining anodes of the device;
a metal grid disposed over the ADL, adjacent ADLs defining sub-pixels of the device;
a plurality of sub-circuits, each sub-circuit comprising:
the metal grid disposed on the ADL;
inorganic overhang structures disposed on the metal grid;
a first plurality of sub-pixels, each sub-pixel of the first plurality of sub-pixels comprising:
an anode defined by the ADL;
an organic light-emitting diode (OLED) material disposed over and in contact with the anode; and
a cathode disposed over the OLED material;
at least one contact overhang disposed on a respective assistant cathode line of the metal grid, the contact overhang disposed between two sub-pixels of the first plurality of sub-pixels, wherein the cathode contacts the contact overhang; and
pixel-defining layer (PDL) structures disposed over the ADL,
wherein adjacent PDL structures further define the first plurality of sub-pixels of the sub-circuit, and
wherein the metal grid is exposed through exposed portions of the PDL structures, the at least one contact overhang disposed on the metal grid in the exposed portions.

8. The device of claim 7, wherein each sub-pixel of the first plurality of sub-pixels further comprises an encapsulation layer disposed over the cathode, the contact overhang, the at least one contact overhang, and the inorganic overhang structures.

9. The device of claim 8, wherein the encapsulation layer contacts a structure stem portion and a structure bottom surface of the inorganic overhang structures.

10. The device of claim 8, further comprising an intermediate layer and a global passivation layer disposed over the inorganic overhang structures, the at least one contact overhang, and the encapsulation layer.

11. The device of claim 7, wherein the cathode contacts at least a stem portion of the at least one contact overhang.

12. The device of claim 7, wherein the inorganic overhang structures have an overhang structure ratio defined as a ratio of an overhang structure height to an overhang structure depth, wherein the overhang structure ratio is about 1.0:1.2 to about 1.0:1.3.

13. The device of claim 7, wherein the at least one contact overhang has a contact overhang ratio defined as a ratio of an overhang height to an overhang depth, wherein the contact overhang ratio is about 1.0:1.0 to about 1.0:1.5.

14. The device of claim 7, wherein the at least one contact overhang includes a stem portion and an overhang portion, wherein the overhang portion is wider than the stem portion to form a first overhang.

15. The device of claim 7, wherein the plurality of metal layers are perpendicular to the metal grid.

16. A device, comprising:
a substrate;
a plurality of metal layers disposed over the substrate and an anode-defining layer (ADL) disposed over the plurality of metal layers and the substrate, the ADL defining anodes of the device;
a metal grid disposed over the ADL, adjacent ADLs defining sub-pixels of the device;

a plurality of sub-circuits, each sub-circuit comprising:
  the metal grid disposed on the ADL;
  inorganic overhang structures disposed over the metal grid;
  a first plurality of sub-pixels, each sub-pixel of the first plurality of sub-pixels comprising:
    an anode defined by the ADL;
    an organic light-emitting diode (OLED) material disposed over and in contact with the anode; and
    a cathode disposed over the OLED material; and
  at least one contact overhang disposed on a respective assistant cathode line of the metal grid, the contact overhang disposed between two sub-pixels of the first plurality of sub-pixels, wherein the cathode contacts at least a stem portion of the at least one contact overhang, wherein the at least one contact overhang includes a contact overhang ratio defined as a ratio of an overhang height to an overhang depth, and wherein the contact overhang ratio is about 1.0:1.0 to about 1.0:1.5.

17. The device of claim 16, further comprising pixel-defining layer (PDL) structures disposed over the ADL, wherein adjacent PDL structures further define the first plurality of sub-pixels of the sub-circuit and the metal grid is exposed through exposed portions of the PDL structures, the at least one contact overhang disposed on the metal grid in the exposed portions.

18. The device of claim 16, wherein each sub-pixel of the first plurality of sub-pixels further comprises an encapsulation layer disposed over the cathode, the contact overhang, the at least one contact overhang, and the inorganic overhang structures and wherein the encapsulation layer contacts a structure stem portion and a structure bottom surface of the inorganic overhang structures.

19. A device, comprising:
a substrate;
a plurality of metal layers disposed over the substrate and an anode-defining layer (ADL) disposed over the plurality of metal layers and the substrate, the ADL defining anodes of the device;
a metal grid disposed over the ADL, adjacent ADLs defining sub-pixels of the device;
a plurality of sub-circuits, each sub-circuit comprising:
  the metal grid disposed on the ADL;
  inorganic overhang structures disposed on the metal grid;
  a first plurality of sub-pixels, each sub-pixel of the first plurality of sub-pixels comprising:
    an anode defined by the ADL;
    an organic light-emitting diode (OLED) material disposed over and in contact with the anode; and
    a cathode disposed over the OLED material; and
  at least one contact overhang disposed on a respective assistant cathode line of the metal grid, the contact overhang disposed between two sub-pixels of the first plurality of sub-pixels, wherein the cathode contacts the contact overhang, wherein the inorganic overhang structures have an overhang structure ratio defined as a ratio of an overhang structure height to an overhang structure depth, and wherein the overhang structure ratio is about 1.0:1.2 to about 1.0:1.3.

20. A device, comprising:
a substrate;
a plurality of metal layers disposed over the substrate and an anode-defining layer (ADL) disposed over the plurality of metal layers and the substrate, the ADL defining anodes of the device;
a metal grid disposed over the ADL, adjacent ADLs defining sub-pixels of the device;
a plurality of sub-circuits, each sub-circuit comprising:
  the metal grid disposed on the ADL;
  inorganic overhang structures disposed on the metal grid;
  a first plurality of sub-pixels, each sub-pixel of the first plurality of sub-pixels comprising:
    an anode defined by the ADL;
    an organic light-emitting diode (OLED) material disposed over and in contact with the anode; and
    a cathode disposed over the OLED material; and
  at least one contact overhang disposed on a respective assistant cathode line of the metal grid, the contact overhang disposed between two sub-pixels of the first plurality of sub-pixels, wherein the cathode contacts the contact overhang, wherein the at least one contact overhang has a contact overhang ratio defined as a ratio of an overhang height to an overhang depth, and wherein the contact overhang ratio is about 1.0:1.0 to about 1.0:1.5.

* * * * *